United States Patent [19]
London

[11] Patent Number: 6,114,731
[45] Date of Patent: Sep. 5, 2000

[54] LOW CAPACITANCE ESD STRUCTURE HAVING A SOURCE INSIDE A WELL AND THE BOTTOM PORTION OF THE DRAIN INSIDE A SUBSTRATE

[75] Inventor: Arnold London, San Jose, Calif.

[73] Assignee: Adaptec, Inc., Milpitas, Calif.

[21] Appl. No.: 09/049,375

[22] Filed: Mar. 27, 1998

[51] Int. Cl.$^7$ .................................. H01L 27/76
[52] U.S. Cl. ..................... 257/355; 257/335; 257/357; 257/360
[58] Field of Search .................. 257/355–360, 257/335

[56] References Cited

U.S. PATENT DOCUMENTS

| | | | |
|---|---|---|---|
| 4,893,168 | 1/1990 | Takahashi et al. | 357/68 |
| 4,945,395 | 7/1990 | Suehiro | 357/40 |
| 5,019,889 | 5/1991 | Yoshio et al. | 357/42 |
| 5,063,429 | 11/1991 | Crafts | 357/40 |
| 5,087,955 | 2/1992 | Futami | 357/41 |
| 5,347,150 | 9/1994 | Sakai et al. | 259/203 |
| 5,365,091 | 11/1994 | Yamagishi | 257/203 |
| 5,581,202 | 12/1996 | Yano et al. | 326/101 |
| 5,637,902 | 6/1997 | Liang | 257/357 |
| 5,751,507 | 5/1998 | Watt et al. | 361/56 |

OTHER PUBLICATIONS

Unknown, "Basics of Electrostatic Discharge Part One—An Introduction to ESD", Special to *Compliance Engineering* Magazine, © 1996, 1997, 1998, The ESD Association, Rome, NY.

Unknown, "Basics of Electrostatic Discharge Part Two—Principles of ESD Control", Special to *Compliance Engineering* Magazine, EOS/ESD Symposium Proceedings, 1980, The ESD Association, Rome, NY.

*Primary Examiner*—Fetsum Abraham
*Attorney, Agent, or Firm*—Martine Penilla & Kim, LLP

[57] ABSTRACT

Disclosed is an electrostatic discharge protection transistor having low input capacitance and method for making the same. The electrostatic discharge protection transistor includes a semiconductor substrate having a diffusion well and a source that is defined in the diffusion well. Further included is a drain that has a first sidewall, a second sidewall, and a lower diffusion floor. The first sidewall is located proximate to a channel region that lies between the source and the drain. Also, a polysilicon gate is disposed over the surface of the semiconductor substrate such that the polysilicon gate is defined between the source and the drain. Wherein the first sidewall of the drain is defined in the diffusion well and the lower diffusion floor of the drain is defined outside of the diffusion well and inside the semiconductor substrate.

20 Claims, 8 Drawing Sheets

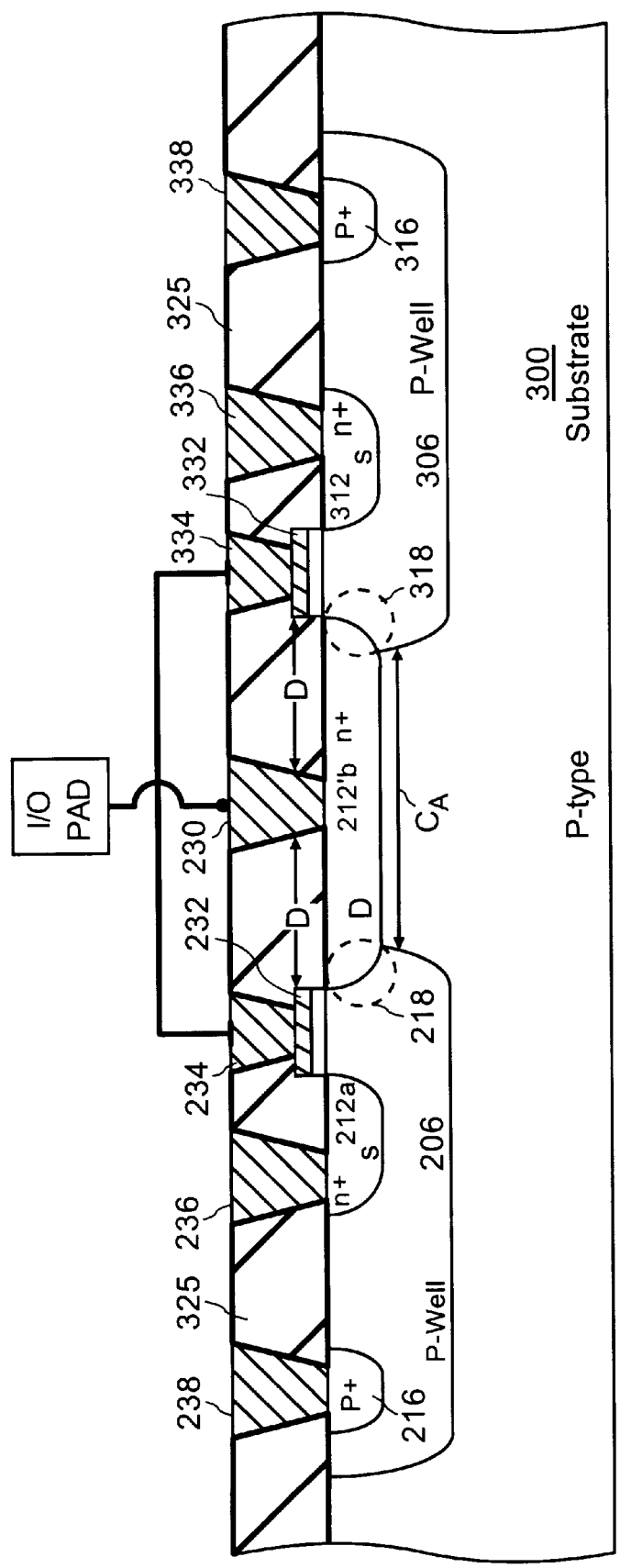

LOW CAPACITANCE ESD STRUCTURE HAVING A SOURCE INSIDE A WELL AND THE BOTTOM PORTION OF THE DRAIN INSIDE A SUBSTRATE

BACKGROUND OF THE INVENTION

1. Field of the Invention

This invention relates generally to integrated circuits, and more particularly to semiconductor devices used in electrostatic discharge applications.

2. Description of the Related Art

Most integrated circuit applications have some type of electrostatic discharge (ESD) circuitry that is used to absorb electrostatic charges that may inadvertently destroy circuit devices that operate at relatively low voltage levels. Typically, ESD circuitry is designed in an input/output (I/O) cell that includes circuitry for applying signals from an I/O pad into a core circuitry region. The I/O cell also typically includes amplification circuitry for amplifying and driving signals that are generated within the core circuitry out to the I/O pad that may be coupled to a lead of a packaged device.

FIG. 1A shows typical I/O circuitry that is used to interface with semiconductor circuits that are laid out in the core circuitry 110. As mentioned above, the I/O circuitry generally includes ESD circuitry that protects the first input gate 108 and the core circuitry 110 from high voltage charges that are commonly transferred by casual human handling. By way of example, if a person touches a lead or an electrical contact that is electrically connected to an I/O pad 102, a charge from the person's body can be transferred to tiny semiconductor devices lying within the core circuitry 110. As is well known, these human transferred charges are typically much greater than what the gate oxide of the first input gate 108 and the core circuitry 110 is capable of handling (and may cause some devices to be permanently destroyed). As a result, ESD circuitry is used to prevent such damage to the first input gate 108 and the core circuitry 110.

In this example, the I/O circuitry is capable of handling ESD events as well as normal input and output operations. During a normal input operation from the I/O pad 102, signals are transferred from the I/O pad 102 to an inverter 108, which assists in buffering the signals that are being passed to selected circuits that lie within the core circuitry 110. Normal output operations may be performed from within the core circuitry 110 out to the I/O pad 102, through one of a P-channel transistor 106 or an N-channel transistor 104. In some applications, the N-channel transistor 104 is only used for electrostatic discharge (ESD) operations, and therefore will not be used as an output device. When that is the case, the gate of the N-channel transistor 104 is coupled through a resistor 112 that is connected to ground (GND). A similar resistor "R" (not shown) can also be coupled to the gate of the P-channel transistor 106.

Accordingly, the transistor 104 is designed to receive a high voltage discharge during an ESD event through its drain terminal, which is caused to breakdown at the drain to bulk interface of the transistor 104. As will be illustrated below, the ability of the transistor 104 to enter into the breakdown state, and then shift into a snap-back operation enables the N-channel transistor 104 to adequately absorb the ESD event charge (i.e., without destroying circuits within the core circuitry 110). The snap-back characteristic is shown in FIG. 1C below, and illustrates that a lower voltage impedance is produced during snap-back, which therefore provides a lower resistance path for current to flow from the drain to the source that is connected to ground.

FIG. 1B shows a cross-sectional view of the prior art N-channel transistor 104 which has the pad 102 connected to a drain 124b. In this example, the N-channel transistor 104 is formed over a P-type substrate 120. The P-type substrate 120 typically has an acceptor atom concentration $N_A$ of about $10^{15}$ atoms per cm$^3$. The semiconductor substrate 120 has a diffused P-well region 122 (i.e., P-). The diffused P-well region 122 typically has an acceptor atom concentration of about $10^{17}$ to about $10^{18}$ atoms per cm$^3$ at the diffusion surface. As is well known, the acceptor atom concentration decreases as the acceptor atoms diffuse into the substrate. Diffused within the P-well region 122 are two N-type diffusion regions 124a and 124b. Diffusion region 124a functions as a source and diffusion region 124b functions as a drain of the N-channel transistor 104.

Also diffused into the diffusion region 122 is a P+ contact region 134 which provides electrical contact with the substrate through a conductive contact 132. The N-channel transistor 104 has a gate oxide and an overlying polysilicon gate 136, which lies between the N-type diffusion regions 124a and 124b. Deposited and/or grown over the substrate is an oxide layer 125, which has various contacts defining paths down to the N-channel transistor 104 and the substrate contact 134. In this manner, a contact 126 can make an electrical connection down to the drain diffusion region 124b, a contact 128 can make an electrical connection down to the gate 136, a contact 130 can make an electrical connection down to the source diffusion region 124a, and the contact 132 can make an electrical connection down to the substrate contact 134.

In typical cases, the polysilicon gate 136 is coupled to the resistor 112, which is then coupled to ground. The resistor 112 may be formed from the n+ or n-well diffusion or the polysilicon gate. Contact 130 is also coupled to ground so that the source can provide a path down to ground during an ESD event. The substrate contact 134 is also coupled to ground through the contact 132. As mentioned above, during an ESD event a charge is typically received through the I/O pad 102 and then coupled down to the drain 124b. If the ESD charge has positive polarity, charge will build up in the depletion region of the drain 124b. The electric field in the depletion region is greatest at a junction 123, which defines an interface between the drain and the bulk of the substrate within the P-well diffusion region 122, and when a critical value is reached, approximately $3 \times 10^5$ volts/cm, avalanche breakdown of the junction occurs.

Initially, current that is produced from a positive charged ESD event will flow through a path of least resistance, which is a path 121 defined from the drain diffusion region 124b to the substrate contact 134, and then to ground. As the charge builds up in the depletion region of drain 124b on either side of the junction 123, the N-channel transistor 104 will begin to reach its breakdown at a point "A," as shown in FIG. 1C. In this example, it is assumed that the voltage between the gate 136 and the source 124a is equal to zero (i.e., $V_{GS}=0$), and that breakdown will occur in the depletion region just under gate 136 when the voltage between the drain 124b and the source 124$_a$ reaches about 12 volts (i.e., $V_{DS}=12$). Thus, at point A, the device will experience breakdown and then go into the aforementioned snap-back condition at a point "B" as drain current $I_D$ increases. The snapback occurs when source region 124 begins injecting electrons into substrate 122 due to current flowing through bulk resistance R1 and causing a forward bias voltage of 0.5V. These added electrons inject into the drain depletion region and cause the well known bipolar transistor snapback effect.

When snap-back occurs, current $I_D$ will then commence to flow from the drain 124b to the source 124a at a reduced resistance. Once this happens, the current $I_D$ will flow to ground through the contact 130, and the voltage between the drain 124b and the source 124a will decrease to about 8 volts. As the voltage continues to build up between the drain 124b and source 124a, the current $I_D$ flowing through the drain 124b will continue to increase up to a point "C." At point C, the N-channel transistor 104 may fall into what is known as a second breakdown. Unfortunately, a second breakdown can cause a destructive event by permanently damaging the N-channel transistor 104, thereby disabling the ESD protection provided for the first input stage 108 and the core circuitry 110 of FIG. 1A and causing the circuit not to meet its desired parameters.

In this example, point C occurs at a current $I_{D1}$, but that point may be increased to a level shown as point D by appropriately placing the contact 126 to the drain 124b at a predetermined distance "D," as shown in FIG. 1D. That is, by separating the contact 126 by a distance D, a built-in ballast resistance is achieved. For example, a ballast resistor 142 is pictorially shown in FIG. 1E, and can therefore be used to delay the second breakdown until a point D.

FIG. 1E also shows how fixed positive charges 144 build up in the drain 124b and fixed negative charges 145 build up in substrate 122 causing formation of depletion region 140 around the junction 123 of the drain 124b and the P-well diffusion region 122. As pictorially shown, when the transistor 104 reaches a breakdown stage of point A as shown in FIG. 1C and causes current to flow through resistor R1, the source 124a will begin to inject electrons toward the junction 123 as source region 124a becomes forward biased. As is well known, this injection of electrons facilitates the flow of current from the drain 124b to the source 124a, and therefore causes the snap-back event that is illustrated as point B in FIG. 1C.

When a negative ESD charge is applied to drain region 124b with respect to substrate region 122, current is easily conducted to ground through a low impedance forward biased N+/P− junction. This condition is typically much easier to protect against than the previously described positive charge situation. In the design of high performance applications, there is always a need for robust ESD performing devices as well as a need for faster performing devices. Unfortunately, better performing ESD devices typically suffer in having higher input capacitance, which in turn reduces the switching speed of a device. As such, designers are often required to make a tradeoff between speed and good ESD performance.

For example, in order to place the contact 126 a distance D away from the gate 136 as shown in FIG. 1D, a larger drain 124b will be needed to ensure proper interconnection of the contact 126. As is well known, when the drain region 124b is increased, the junction capacitance Cj of the transistor increases. In general, the junction capacitance Cj includes two components, which are proportionally increased or decreased depending on the physical size of the diffusion drain region 124b. As pictorially shown, one component is the sidewall capacitance "$C_S$" and another usually larger and more dominant component is the area capacitance "$C_A$" (i.e., $Cj=C_S+C_A$).

Another capacitance component is the overlap capacitance "$C_{Ol}$" which is derived from the slight overlap of the gate 136 over the drain 124b. Another input capacitance component is that which is associated with a packaged device, in which the core circuitry 110, I/O circuitry, and I/O pad 102 are packaged within. This component of input capacitance is pictorially shown in FIG. 1B as "$C_{PACK}$". Of course, other parasitic components of input capacitance may also be present, in addition to the capacitance of the input gate 108 being protected.

Although there are various components which add up to produce a total input capacitance and thereby reduce the speed at which a particular integrated circuit can operate, the area capacitance "$C_A$" of the drain region 124b will generally contribute the most to the total input capacitance. However, as mentioned above, a large physical drain region is needed in order to maintain the separation D between the contact 126 and the gate 136 (i.e., to provide improved ESD performance).

The area capacitance "$C_A$" contributes the most to the total input capacitance component because the junction capacitance Cj is proportional to the square root of the acceptor atom concentration in the P-well diffusion region 122 (i.e., $C_j \alpha \sqrt{N_A}$) for a step junction, and the drain-substrate junction can be approximated as a step junction. As mentioned above, the P-well diffusion region 122 typically requires a concentration of about $10^{17}$ atoms per $cm^3$ to about $10^{18}$ atoms per $cm^3$ at the die surface. Unfortunately, to maintain a high level of ESD and switching performance, that range of acceptor atom concentration is required at the junction 123 and channel region under gate 136 to meet required ESD protection. The need to preserve sufficient contact-to-gate space for good ESD performance also contributes to higher values of $C_A$ than typical devices not having this constraint. As a result, the junction capacitance Cj must be maintained relatively high for good performing ESD devices, and therefore, the input capacitance will also remain relatively high. Thus, good ESD performing devices are traditionally slower because they have a higher input capacitance.

In view of the foregoing, what is needed is a transistor structure which provides a high level of ESD protection while also providing reduced input capacitance parameters.

SUMMARY OF THE INVENTION

Broadly speaking, the present invention fills these needs by providing a semiconductor transistor structure which provides a high level of ESD protection while also providing reduced input capacitance parameters. It should be appreciated that the present invention can be implemented in numerous ways, including as a process, an apparatus, a system, a device, a method, or a computer readable medium. Several inventive embodiments of the present invention are described below.

In one embodiment, a semiconductor structure having electrostatic discharge charge protection characteristics and reduced input capacitance is disclosed. The semiconductor structure includes a p type semiconductor substrate having a p-well, and an n+ diffusion source that is defined in the p-well. The semiconductor structure further includes an n+ diffusion drain having sidewalls and a bottom portion, and at least one of the sidewalls is substantially defined in the p-well and the bottom portion of the n+ diffusion drain is defined in the p type semiconductor substrate. Preferably, a gate structure is defined over the p type semiconductor substrate between the n+ diffusion source and the n+ diffusion drain.

In another embodiment, an electrostatic discharge protection transistor having low input capacitance is disclosed. The electrostatic discharge protection transistor includes a semiconductor substrate having a diffusion well and a source that is defined in the diffusion well. Further included is a drain that has a first sidewall, a second sidewall, and a lower diffusion floor. The first sidewall is located proximate to a channel region that lies between the source and the drain. Also, a polysilicon gate is disposed over the surface of the semiconductor substrate such that the polysilicon gate is defined between the source and the drain. Wherein the first sidewall of the drain is defined in the diffusion well and the lower diffusion floor of the drain is defined outside of the diffusion well and inside the semiconductor structure.

In yet another embodiment, a method for making an electrostatic discharge protection transistor having low input capacitance in a semiconductor substrate is disclosed. The method includes forming a diffusion well in the semiconductor substrate. Forming a source in the diffusion well and a drain that has sidewalls and a bottom region. In this embodiment, at least one of the sidewalls is formed in the diffusion well and substantially all of the bottom region of the drain is formed in the semiconductor substrate and outside of the diffusion well. Further, a transistor gate is formed over the semiconductor substrate and between the source and the drain.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 3A shows a pair of N-channel transistors which are connected in parallel and share a drain in accordance with one embodiment of the present invention.

DETAILED DESCRIPTION OF THE PREFERRED EMBODIMENTS

An invention is described for a semiconductor transistor structure and a method for making the structure which provides a high level of ESD protection while also providing a reduced level of input capacitance. It will be obvious, however, to one skilled in the art, that the present invention may be practiced without some or all of these specific details. In other instances, well known process operations have not been described in detail in order not to unnecessarily obscure the present invention.

Figure 1A:
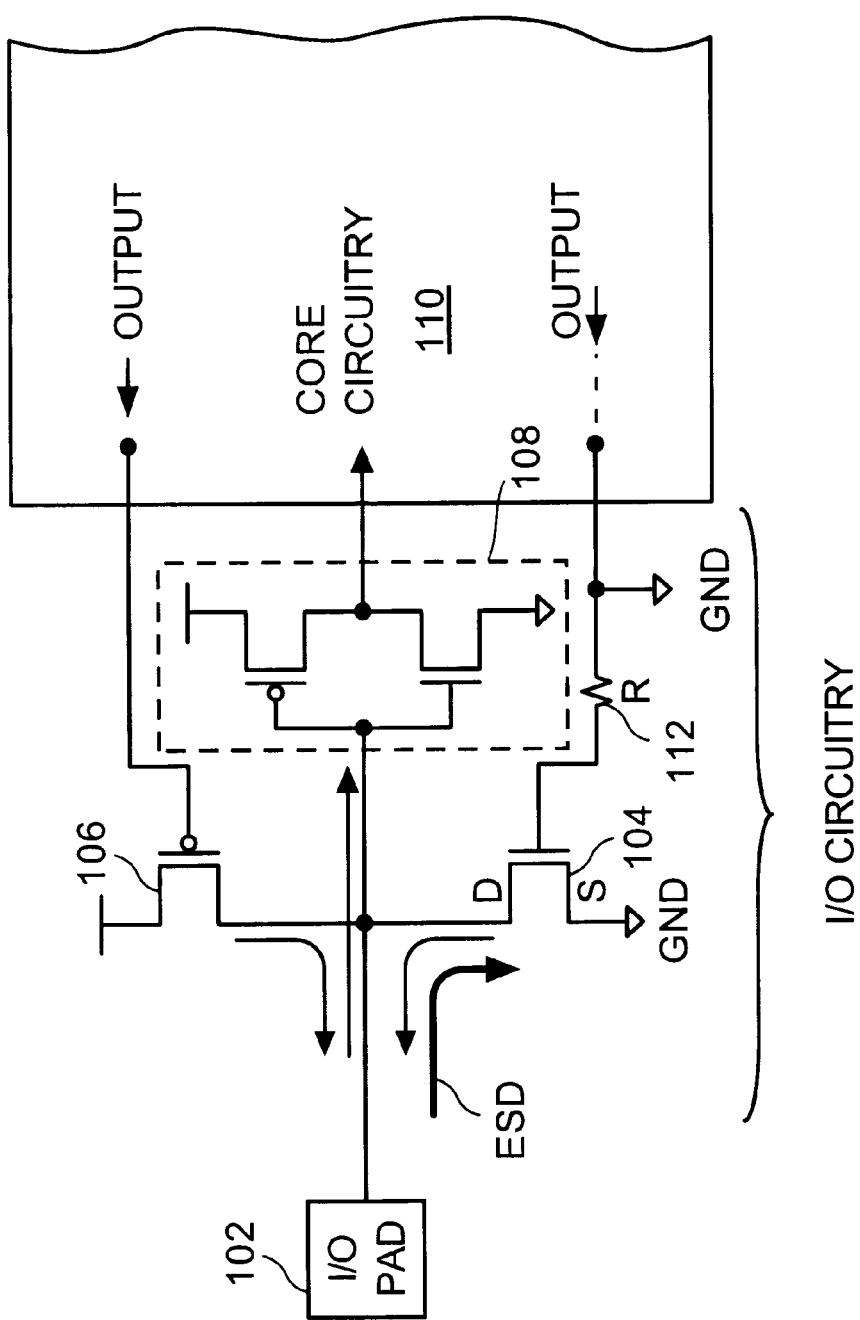
FIG. 1A shows typical I/O circuitry that is used to interface with semiconductor circuits that are laid out in the core circuitry of a chip.
Figure 1B:
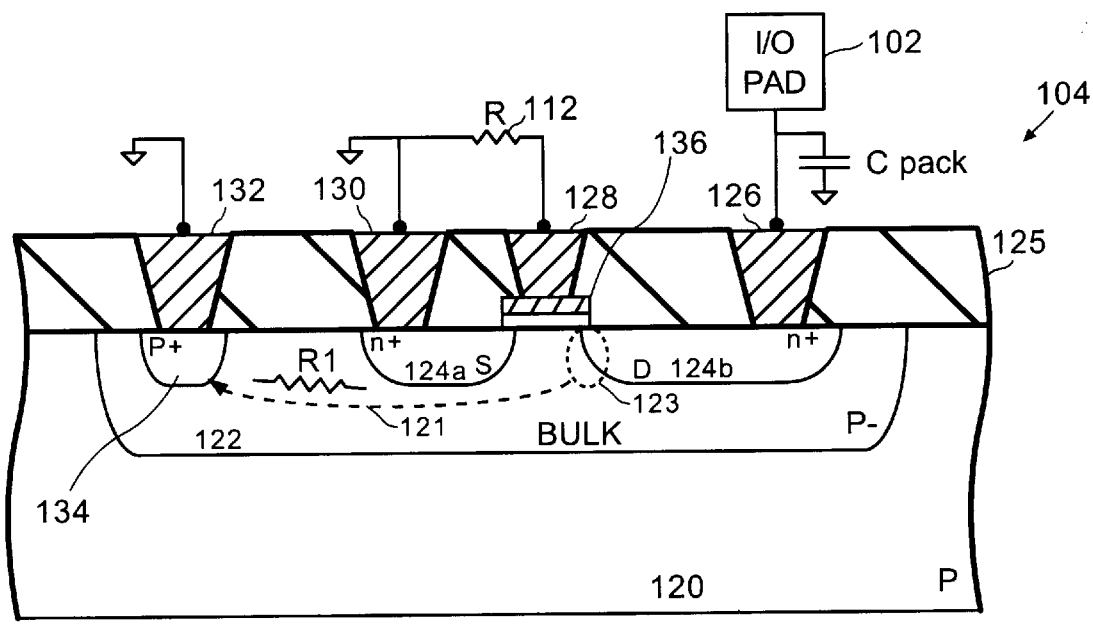
FIG. 1B shows a cross-sectional view of the prior art N-channel transistor which has a pad connected to a drain.
Figure 1C:
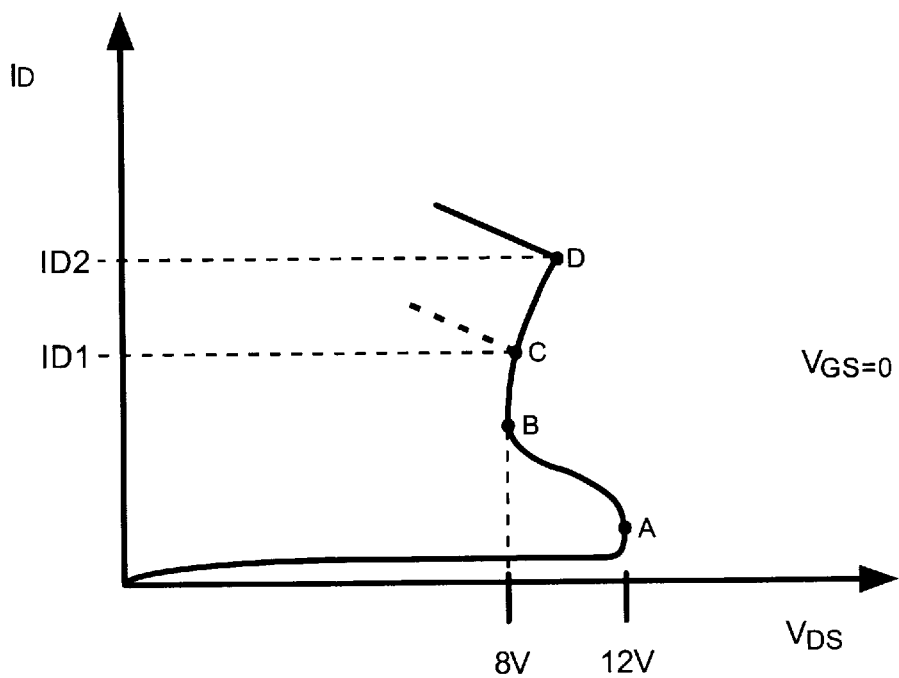
FIG. 1C shows a graph illustrating an avalanche breakdown, snap-back and second breakdown conditions of the transistor of FIG. 1B.
Figure 1D:
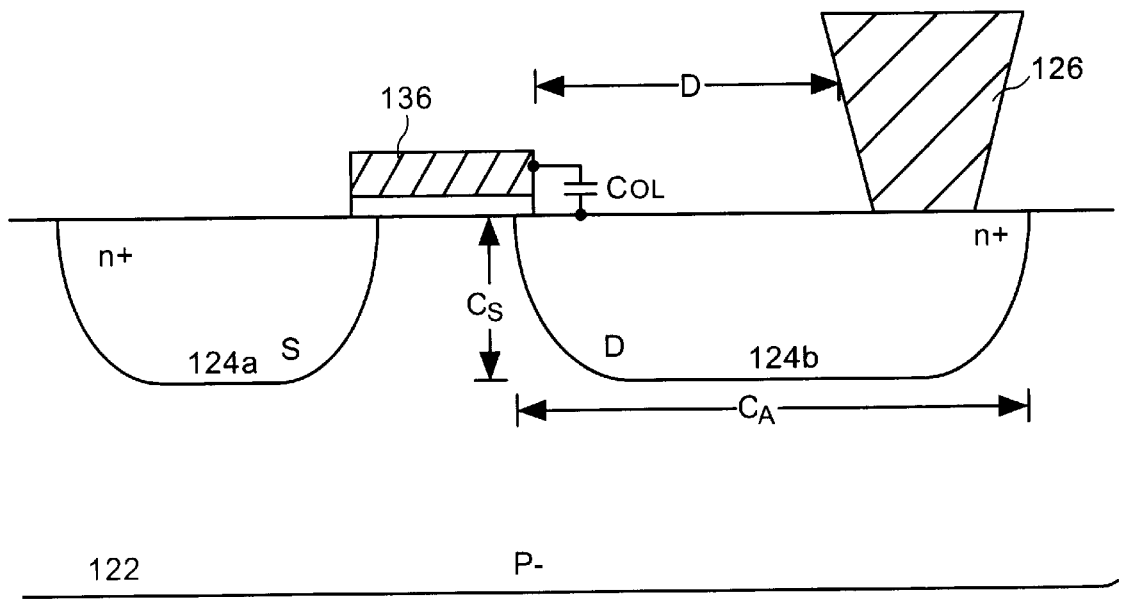
FIGS. 1D–1E show magnified representations of the n-channel source drain and p-well regions of the transistor of FIG. 1B.
Figure 1E:
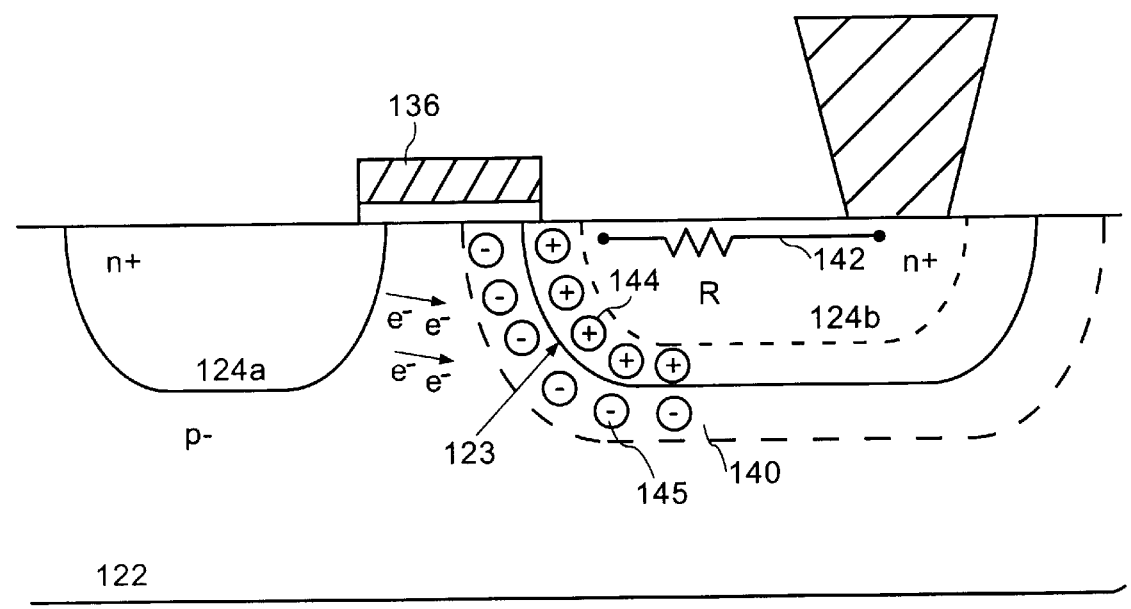
Figure 2A:
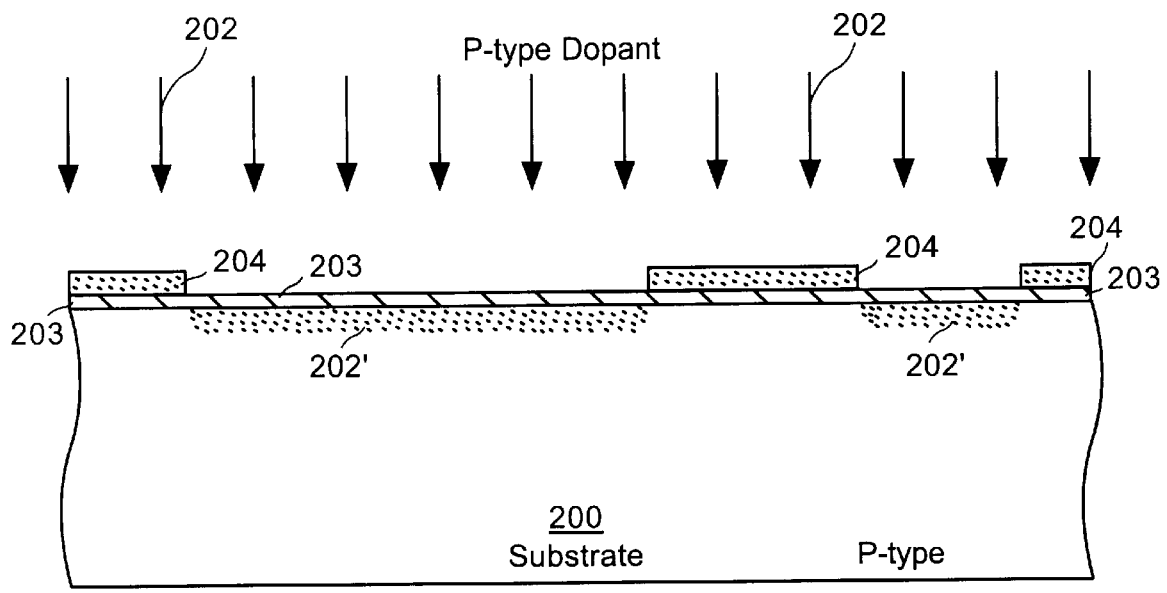
FIGS. 2A–2D show cross sectional views of a semiconductor substrate during processing operations performed during the manufacture of a transistor in accordance with one embodiment of the present invention.

FIG. 2A shows a cross sectional view of a semiconductor substrate 200 during a processing operation in accordance with one embodiment of the present invention. In one embodiment, the semiconductor substrate 200 is a lightly doped P-type substrate having a concentration of about $10^{15}$ atoms per centimeters cubed. A silicon dioxide ($SiO_2$) layer 203 may then formed over the substrate to prevent subsequent photoresist layer 204 from coming in direct contact with the substrate 200. The $SiO_2$ layer 203 can be thermally grown or deposited to a desired thickness. Once the $SiO_2$ layer 203 is formed, a photoresist material is spin-coated over the $SiO_2$ layer 203 and then patterned to form a photoresist mask 204. In general, the patterning can be performed using any conventional photolithography reticle mask and stepper apparatus. The $SiO_2$ layer 203 can then be etched in the well regions, or alternatively, the $SiO_2$ layer 203 can remain in the well regions and then implanted impurities will go through the oxide material when sufficient implant energy is applied.

Figure 2B:
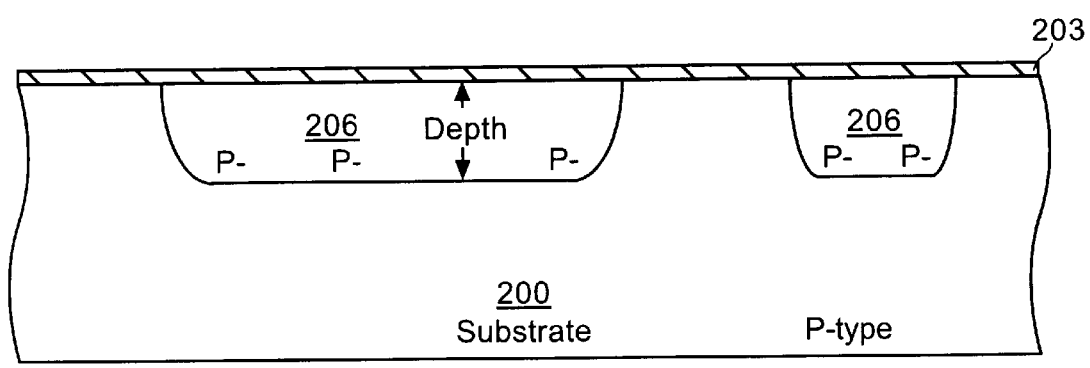

Once the photoresist mask 204 has been defined, a P-type dopant 202 is implanted over the surface of the semiconductor substrate 200. The P-type dopant 202 is therefore concentrated as implanted dopant 202' where the photoresist mask 204 is not covering the surface of the semiconductor substrate 200. Once a desired level of dopant has been implanted, the photoresist mask 204 is stripped and then the substrate is subjected to a high temperature diffusion process. During the diffusion process, a sufficiently high temperature of about 1100 degrees Celsius assists in driving in the implanted dopant 202' into the substrate 200 as shown in FIG. 2B. In a CMOS process, a similarly implanted region with n-type dopant may also be driven in at the same time to form N wells.

Preferably, the diffused regions 206 form P-well regions which have higher surface concentrations of between about $10^{16}$ and about $10^{19}$ atoms per $cm^3$, and more preferably about $10^{17}$ atoms per $cm^3$. In this manner, the P-well will have a "depth" of between about 1.0 microns and about 6 microns, and more preferably about 3 microns. In this example, the semiconductor transistor device is manufactured in accordance with 0.6 micron technology processes. Of course, suitable dimensions for smaller or large feature size technology processes will also work. The diffusion regions 206 therefore define P-wells in which an N-channel transistor device will subsequently be defined.

Figure 2C:
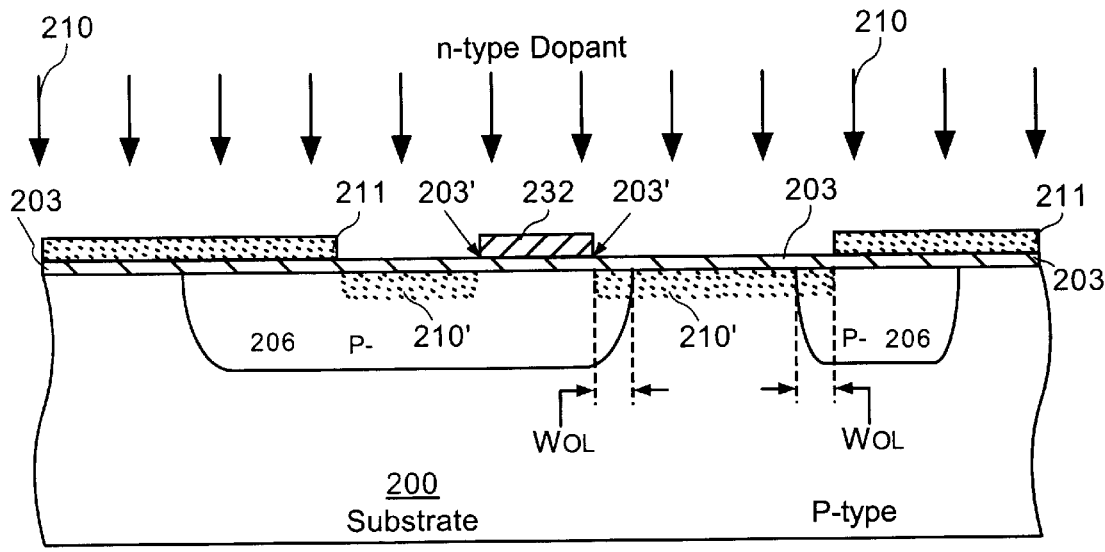

Once the well regions 206 have been formed along with subsequent substrate dopings, field and gate oxide formation, and gate electrode formation, a photoresist mask 211 is formed over the surface of the semiconductor substrate 200 as shown in FIG. 2C. Once the photoresist mask 211 has been defined, an N-type dopant is implanted into regions where the photoresist mask, field oxide, and gate electrode 232 are not covering the substrate. As shown, the N-type dopant will therefore produce implanted dopant 210' in portions of the P-well diffusion region 206 and part of the P-type semiconductor substrate 200. At this point, the photoresist mask 211 is stripped. The semiconductor substrate 200 is subjected to subsequent elevated processing temperatures of about 900 degrees Celsius which causes the implanted N-type dopant to be driven further into the substrate. The diffused N-type dopants therefore form diffused N+ regions which will define a source 212a and a drain 212b of the N-channel transistor.

Figure 2D:
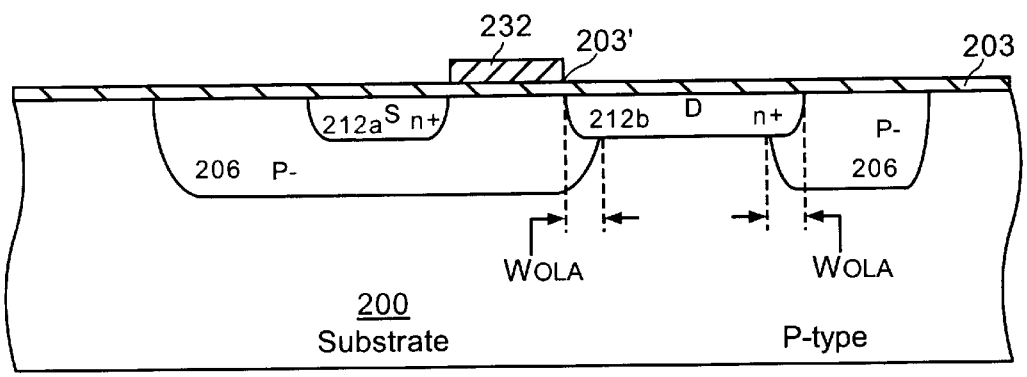

In this embodiment, the P-well mask 204 preferably overlaps the drain 212b by a width $W_{OL}$ (as shown in FIG. 2C) to account for registration and alignment tolerances. The width $W_{OL}$ is preferably about 1 micron and therefore, the P-well 206 should be carefully defined by the photoresist mask 204. The actual overlap, $W_{OLA}$ (as shown in FIG. 2D), will be increased from the drawn overlap, $W_{OL}$, due to lateral diffusion effects and mask misalignment and registration effects inherent in any photolithography process as shown in FIG. 2D. This overlap is generally necessary to ensure that the sidewall junction under the gate electrode 232 between the drain 212b and the P-well 206 is maintained in a region having a higher level of acceptor atom concentration (which will maintain the same n-channel transistor performance characteristics, including ESD, as a device not designed with this low capacitance feature). A sufficient overlap of the P-well 206 under the drain 212b edges defined by field oxide is recommended to avoid field inversion problems. A particular advantage of the present invention is that a lower level of acceptor atom concentration will lie below much of the drain region 212b.

As mentioned above, the area capacitance "$C_A$" component of the junction capacitance "$C_j$" will be substantially reduced due to the lower concentration of acceptor atoms lying below the floor of drain 212b. By way of example, in prior art designs, the concentration below the drain was about $10^{17}$ atoms/cm$^3$, and now the concentration below most of the drain is about $10^{15}$ atoms/cm$^3$. Because the area capacitance is proportional to the concentration, the prior art area capacitance divided by the new area capacitance will produce an approximately ten fold decrease in area capacitance $C_A$ (i.e., $C_{A,\ OLD}/C_{A,\ NEW} = \sqrt{10^{17}}/\sqrt{10^{15}} = 10$).

Figure 2E:
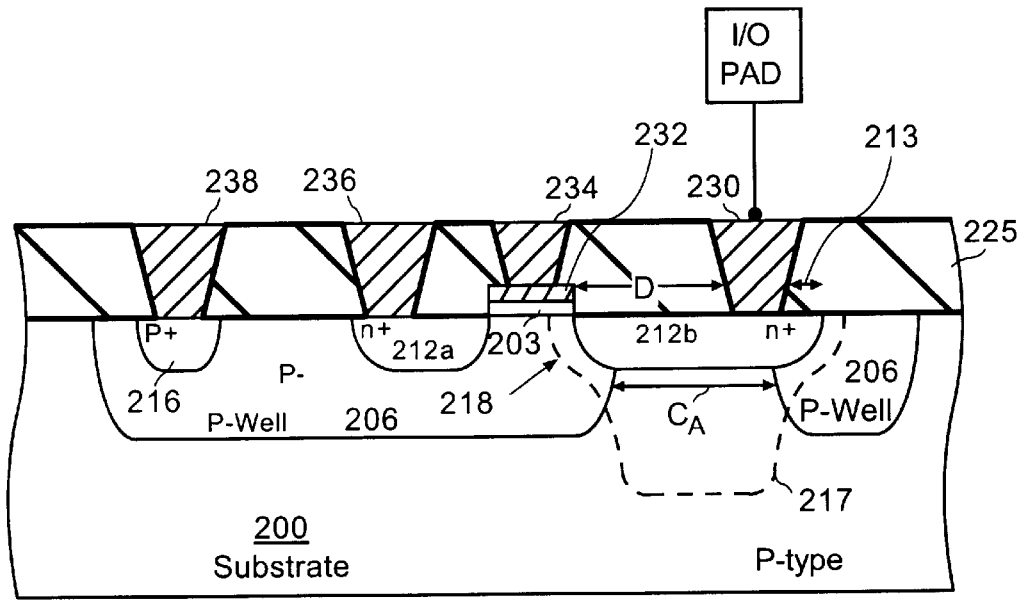
FIG. 2E shows a cross-sectional view of the semiconductor substrate of FIGS. 2A–2D after additional processing is performed in accordance with one embodiment of the present invention.

FIG. 2E shows a cross-sectional view of the semiconductor substrate 200 after additional processing is performed in accordance with one embodiment of the present invention. As shown, a gate 232 is defined over a gate oxide which lies between the source 212a and the drain 212b. Next, a silicon dioxide dielectric layer 225 is deposited over the top surface of the semiconductor substrate 200, including the respective diffused regions, field oxides (not shown) and polysilicon gate 232. Once the silicon dioxide dielectric layer 225 is formed, contact holes are formed in the silicon oxide 225 and electrical contacts are formed.

Figure 2F:
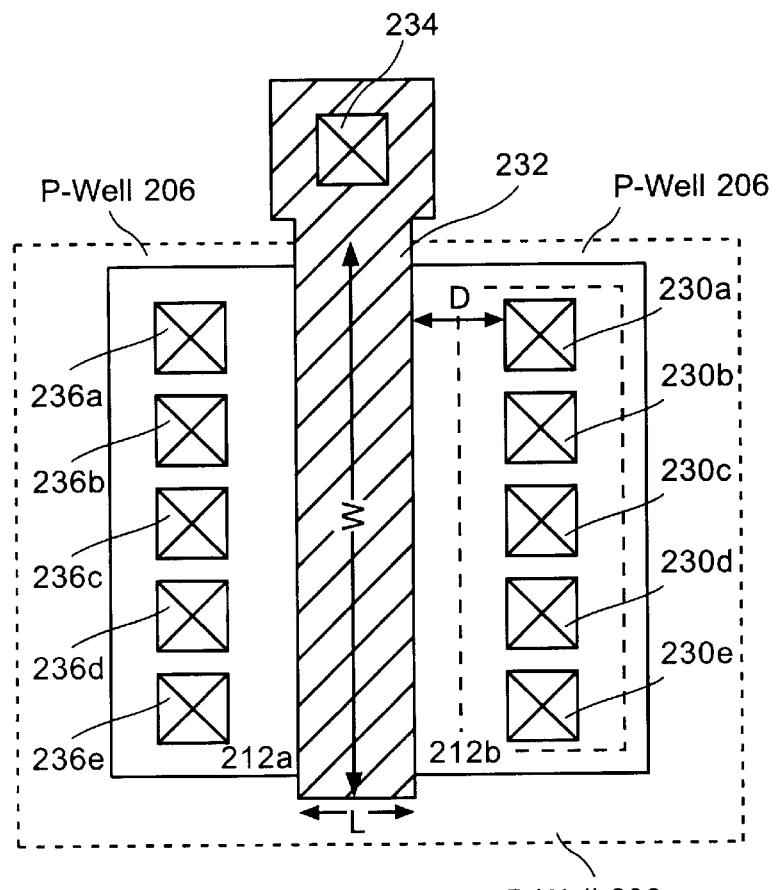
FIG. 2F shows a top view of an N-channel transistor that has an optimum ESD performance characteristic and a low input capacitance in accordance with one embodiment of the present invention.

By way of example, a contact 238 is defined down to a substrate contact region 216, a contact 236 is defined down to the source 212a, a contact 234 is defined down to the gate 232, and a contact 230 is defined down to the drain 212b. The contact 234 to gate 232 is shown in this figure, although in practice, it would normally be offset as shown in FIG. 2F to position it over field oxide. As shown, the I/O pad is typically connected to the contact 230, which makes electrical connection to the drain 212b. As mentioned above, the junction between the gate end of the drain 212b and the P-well 206, which is identified at 218, is maintained within the P-well 206. Of course, in actuality, the junction exists over the entire drain-well/substrate boundary. Further, a depletion region edge 217 that is associated with the drain junction, is shown with a much larger extension into the P-type substrate than into the P-well, indicative of much lower capacitance per unit area.

At the same time, the acceptor atom concentration lying under the drain 112b has been reduced by eliminating the P-well 206 from under most of that portion. As a result, the area capacitance component "$C_A$" of the junction capacitance is substantially reduced, which therefore reduces the input capacitance experienced through the I/O pad. Advantageously, the device is able to operate at a substantially increased speed while maintaining a high level of ESD protection. At the same time, the contact 230 can be maintained at a preferred distance D from the gate 232, which is preferably about 5 microns.

Although this preferred distance D has been maintained, and the drain region 212b has been extended to fit the contact 230, the area capacitance has been decreased from the continuous P-well under drain configuration. In this preferred embodiment, the contact 230 preferably has a side dimension of about 0.6 microns, and a distance 213 of about 0.5 microns or more is maintained from the contact 230 to the edge of the diffusion region 212b.

FIG. 2F shows a top view of the N-channel transistor that has an optimum ESD performance characteristic and a low input capacitance in accordance with one embodiment of the present invention. As shown, the gate 232 has a length and a width which is defined over the N+ source/drain areas prior to N+ dopant implantation. On one side of the gate 232 is the source 212a and on the other side is the drain 212b. The other sides of the source and drain regions are defined by a field oxide, which was also formed prior to the n+ dopant implantation. In a preferred example, a plurality of contacts 236a through 236e are formed in electrical contact with the source 212a. Typically, contacts 236a through 236e are coupled to ground to provide a charge absorbing path for current during an ESD event.

Also shown are a plurality of contacts 230a through 230e, which are formed in electrical contact with the drain region 212b. As pictorially shown, each of the contacts 230a through 230e are separated from the gate 232 by a distance D, which is preferably about 5 microns. Most importantly, the P-well has been custom designed such that it does not lie below most of the area of the drain 212b. However, the P-well 206 is positioned such that the optimum concentration is present at the junction 218, shown in FIG. 2E. As such, the input capacitance is substantially lowered by eliminating the P-well 206 from under much of the drain region 212b.

FIG. 3A shows a pair of N-channel transistors which are connected in parallel and share a drain 212b' in accordance with one embodiment of the present invention. In this embodiment, a second transistor having a gate 332 is formed in substantially the same way as the transistor of FIG. 2E. As in the previous embodiments, the P-well 206 and a P-well 306 of the new transistor are formed such that a majority of the drain 212b' is not formed within the P-well region. In this manner, a lower acceptor atom concentration will lie below the wide drain 212b' and a substantially lower area capacitance is produced, which therefore produces a reduced input capacitance.

In this design, the gates 232 and 332 are coupled in a parallel orientation, and an I/O pad is coupled to the contact 230. The second transistor also has an N+ source 312 which is diffused into the P-well 306 and a contact 336 for making electrical connection down to the source 312 through a silicon dioxide layer 325. Also shown is a contact 338 which makes electrical connection to a substrate contact 316. In general, by having the parallel transistor orientation, in addition to greater output drive current capabilities, a greater degree of ESD protection may be provided when the avalanche breakdown and snap-back conditions occur between the drain 212b' and the respective sources 212a and 312. In addition, the area component of the junction capacitance is also substantially reduced by substantially eliminating the P-well 206 and 306 from under the drain 212b'. Of course, some applications may require 4, 6, 8 or more sets of parallel transistors to accomplish their ESD and drive requirements. Accordingly, the set of 2 parallel transistors should only be considered as one example, and the exact number used usually depends on many factors associated with an application's operation.

Figure 3B:
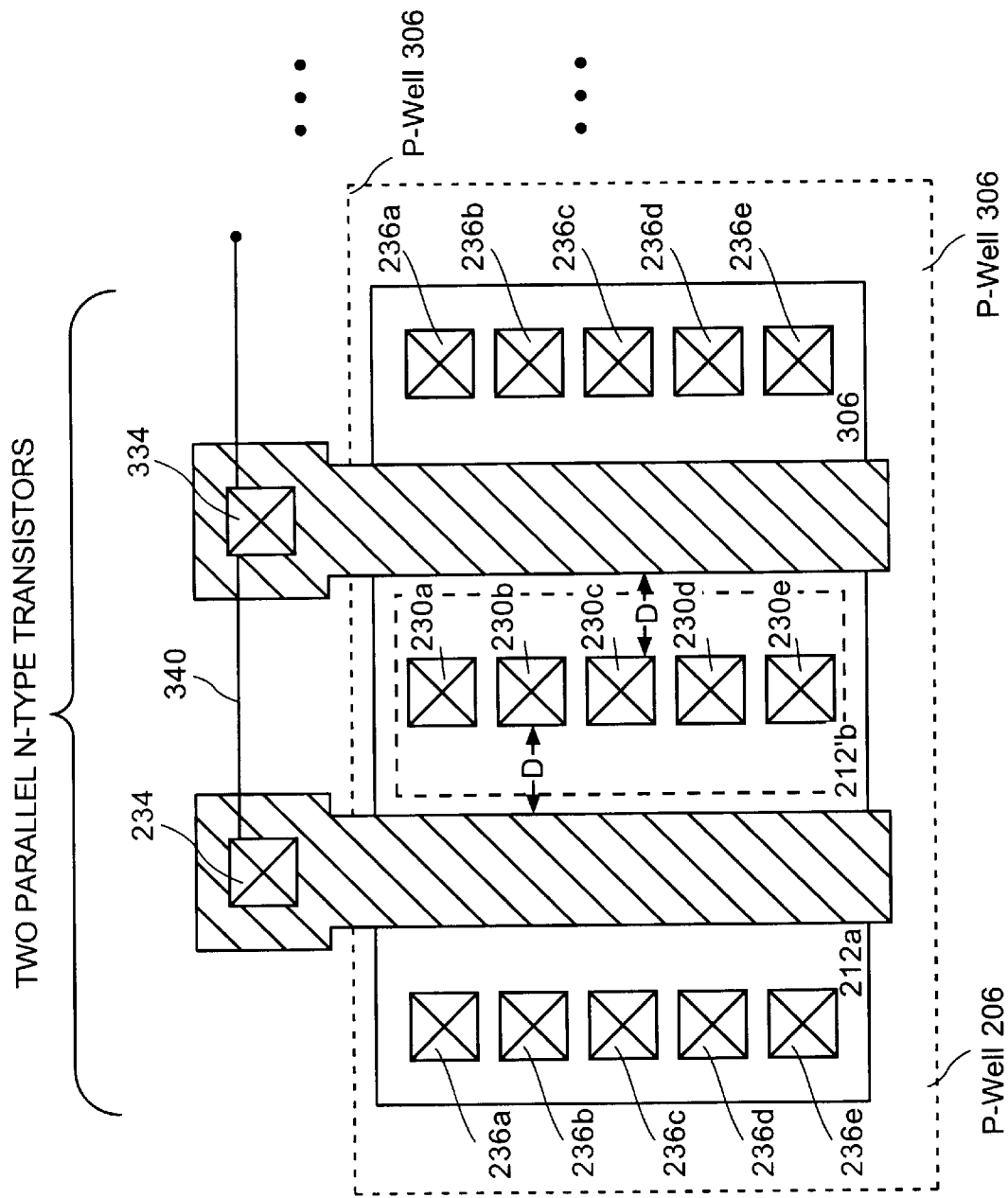
FIG. 3B shows a top view of the two parallel N-channel transistors of FIG. 3A in accordance with one embodiment of the present invention.

FIG. 3B shows a top view of the two parallel N-channel transistors in accordance with one embodiment of the present invention. As in the case of a single transistor device, a plurality of source contacts 236a through 236e are made down to the source 212a. A plurality of contacts 230a through 230e are also made down to the drain 212b'. At the same time, the optimum distance D separation is maintained between the contacts 230 and the respective gates.

Also shown are a plurality of source contacts 336a through 336e which make contact with the source 306. As mentioned above, the P-well 206 and the P-well 306 are designed such that as large a portion of the region as possible, within manufacturing and device performance constraints, does not underlie the drain 212b. As such, a lower junction capacitance is achieved for the area component, and therefore, a substantially reduced input capacitance can be maintained for speed sensitive applications. For example, most network adapter card technologies require good ESD performance, yet also need reduced input capacitance characteristics for achieving improved data transmission speeds. One exemplary network adapter is an UltraSCSI™ adapter card, which is manufactured by Adaptec, Inc., of Milpitas, Calif.

Although the foregoing invention has been described in some detail for purposes of clarity of understanding, it will be apparent that certain changes and modifications may be practiced within the scope of the appended claims. It should therefore be understood that the various semiconductor device diagrams may be embodied in any form which may include, for example, any suitable semiconductor substrate. The semiconductor devices may also be fabricated onto application specific integrated circuit (ASIC) chips, which may then be packaged and integrated onto a printed circuit board. Accordingly, the present embodiments are to be considered as illustrative and not restrictive, and the invention is not to be limited to the details given herein, but may be modified within the scope and equivalents of the appended claims.

What is claimed is:

1. A semiconductor structure having electrostatic discharge charge protection characteristics and reduced input capacitance, comprising:

a p type semiconductor substrate having a p– well;

an n+ diffusion source being defined in the p– well; and an n+ diffusion drain having sidewalls and a bottom portion, and at least one of the sidewalls is substantially defined in the p– well and the bottom portion of the n+ diffusion drain is defined in the p type semiconductor substrate.

2. A semiconductor structure having electrostatic discharge charge protection characteristics and reduced input capacitance as recited in claim 1, further including:

a gate structure defined over the p type semiconductor substrate between the n+ diffusion source and the n+ diffusion drain.

3. A semiconductor structure having electrostatic discharge charge protection characteristics and reduced input capacitance as recited in claim 2, further comprising:

a dielectric layer being defined over the semiconductor substrate including the gate structure.

4. A semiconductor structure having electrostatic discharge charge protection characteristics and reduced input capacitance as recited in claim 3, further comprising:

defining at least one electrical contact through the dielectric layer down to the n+ diffusion drain, the at least one electrical contact being separated from the gate structure by about 5 microns.

5. A semiconductor structure having electrostatic discharge charge protection characteristics and reduced input capacitance as recited in claim 4, further comprising:

an I/O pad being electrically connected to the at least one electrical contact that is made to the n+ diffusion drain.

6. A semiconductor structure having electrostatic discharge charge protection characteristics and reduced input capacitance as recited in claim 5, wherein the n+ diffusion source is coupled to a ground connection through at least one ground contact that is formed through the dielectric layer.

7. A semiconductor structure having electrostatic discharge charge protection characteristics and reduced input capacitance as recited in claim 2, wherein the p type semiconductor substrate has an acceptor atom concentration of about $1 \times 10^5$ atoms/cm$^3$.

8. A semiconductor structure having electrostatic discharge charge protection characteristics and reduced input capacitance as recited in claim 2, wherein the p– well has an acceptor atom surface concentration of between about $1 \times 10^{17}$ atoms/cm$^3$, and about $1 \times 10^{19}$ atoms/cm$^3$.

9. An electrostatic discharge protection transistor having low input capacitance, comprising:

a semiconductor substrate having a diffusion well;

a source being defined in the diffusion well;

a drain having a first sidewall, a second sidewall, and a lower diffusion floor, and the first sidewall is located proximate to a channel region that lies between the source and the drain; and a polysilicon gate being disposed over the surface of the semiconductor substrate such that the polysilicon gate is defined between the source and the drain;

wherein the first sidewall of the drain is defined in the diffusion well and the lower diffusion floor of the drain is defined outside of the diffusion well and inside the semiconductor substrate.

10. An electrostatic discharge protection transistor having low input capacitance as recited in claim 9, wherein the semiconductor substrate is lightly doped.

11. An electrostatic discharge protection transistor having low input capacitance as recited in claim 10, wherein the lightly doped semiconductor substrate has an acceptor atom concentration of about $1 \times 10^{15}$ atoms/cm$^3$.

12. An electrostatic discharge protection transistor having low input capacitance as recited in claim 11, wherein the diffusion well has an acceptor atom surface concentration of between about $1 \times 10^{17}$ atoms/cm$^3$, and about $1 \times 10^{19}$ atoms/cm$^3$.

13. An electrostatic discharge protection transistor having low input capacitance as recited in claim 9, further comprising:

a dielectric layer being defined over the semiconductor surface.

14. An electrostatic discharge protection transistor having low input capacitance as recited in claim 13, further comprising:

at least one electrical contact being defined through the dielectric layer and in contact with the drain, and the at least one electrical contact being separated from the polysilicon gate by about 5 microns.

15. An electrostatic discharge protection transistor having low input capacitance as recited in claim 9, wherein the drain is a shared drain for a second electrostatic discharge protection transistor having low input capacitance.

16. An electrostatic discharge protection transistor having low input capacitance as recited in claim 9, wherein the second electrostatic discharge protection transistor has a second polysilicon gate that is connected in parallel with the polysilicon gate.

17. A semiconductor structure having electrostatic discharge charge protection characteristics and reduced input capacitance, comprising:

an n type semiconductor substrate having a n(−) well;

a p+ diffusion source being defined in the n(−) well; and a p+ diffusion drain having sidewalls and a bottom portion, and at least one of the sidewalls is substantially defined in the n(−) well and the bottom portion of the p+ diffusion drain is defined in the n type semiconductor substrate.

18. A semiconductor structure having electrostatic discharge charge protection characteristics and reduced input capacitance as recited in claim 17, further including:

a gate structure defined over the n type semiconductor substrate between the p+ diffusion source and the p+ diffusion drain.

19. A semiconductor structure having electrostatic discharge charge protection characteristics and reduced input capacitance as recited in claim 18, further comprising:

a dielectric layer being defined over the semiconductor substrate including the gate structure.

20. A semiconductor structure having electrostatic discharge charge protection characteristics and reduced input capacitance as recited in claim 19, further comprising:

defining at least one electrical contact through the dielectric layer down to the p+ diffusion drain, the at least one electrical contact being separated from the gate structure by about 5 microns.

* * * * *